United States Patent
Padmanabhan et al.

(10) Patent No.: US 10,217,737 B2
(45) Date of Patent: *Feb. 26, 2019

(54) CASCODE SEMICONDUCTOR DEVICE STRUCTURE AND METHOD THEREFOR

(71) Applicant: SEMICONDUCTOR COMPONENTS INDUSTRIES, LLC, Phoenix, AZ (US)

(72) Inventors: Balaji Padmanabhan, Tempe, AZ (US); Prasad Venkatraman, Gilbert, AZ (US); Zia Hossain, Tempe, AZ (US); Chun-Li Liu, Scottsdale, AZ (US); Woochul Jeon, Phoenix, AZ (US); Jason Mcdonald, Gilbert, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/648,264

(22) Filed: Jul. 12, 2017

(65) Prior Publication Data
US 2017/0309617 A1 Oct. 26, 2017

Related U.S. Application Data

(62) Division of application No. 14/853,729, filed on Sep. 14, 2015, now Pat. No. 9,741,711.
(Continued)

(51) Int. Cl.
*H01L 29/66* (2006.01)
*H01L 27/06* (2006.01)
(Continued)

(52) U.S. Cl.
CPC ........ *H01L 27/0629* (2013.01); *H01L 21/743* (2013.01); *H01L 21/8258* (2013.01);
(Continued)

(58) Field of Classification Search
CPC ............. H01L 27/0629; H01L 27/0255; H01L 27/0688; H01L 21/743; H01L 21/8258;
(Continued)

(56) References Cited

U.S. PATENT DOCUMENTS 6,404,045 B1 6/2002 Pelly
7,586,156 B2 9/2009 Yedinak et al.
(Continued)

*Primary Examiner* — Dzung Tran
(74) *Attorney, Agent, or Firm* — Kevin B. Jackson

(57) ABSTRACT

In one embodiment, a cascode rectifier structure includes a group III-V semiconductor structure includes a heterostructure disposed on a semiconductor substrate. A first current carrying electrode and a second current carrying electrode are disposed adjacent a major surface of the heterostructure and a control electrode is disposed between the first and second current carrying electrode. A rectifier device is integrated with the group III-V semiconductor structure and is electrically connected to the first current carrying electrode and to a third electrode. The control electrode is further electrically connected to the semiconductor substrate and the second current path is generally perpendicular to a primary current path between the first and second current carrying electrodes. The cascode rectifier structure is configured as a two terminal device.

12 Claims, 7 Drawing Sheets

Related U.S. Application Data

(60) Provisional application No. 62/069,761, filed on Oct. 28, 2014.

(51) Int. Cl.

| | | |
|---|---|---|
| *H01L 27/02* | (2006.01) | |
| *H01L 23/367* | (2006.01) | |
| *H01L 29/417* | (2006.01) | |
| *H01L 29/778* | (2006.01) | |
| *H01L 29/10* | (2006.01) | |
| *H01L 21/8258* | (2006.01) | |
| *H01L 21/74* | (2006.01) | |
| *H01L 29/872* | (2006.01) | |
| *H01L 23/48* | (2006.01) | |
| *H01L 29/861* | (2006.01) | |
| *H01L 29/20* | (2006.01) | |

(52) U.S. Cl.
CPC ...... *H01L 23/3677* (2013.01); *H01L 27/0255* (2013.01); *H01L 27/0266* (2013.01); *H01L 27/0688* (2013.01); *H01L 29/1087* (2013.01); *H01L 29/41766* (2013.01); *H01L 29/7783* (2013.01); *H01L 23/481* (2013.01); *H01L 29/2003* (2013.01); *H01L 29/861* (2013.01); *H01L 29/872* (2013.01); *H01L 2924/0002* (2013.01)

(58) Field of Classification Search
CPC ............. H01L 23/3677; H01L 27/0266; H01L 29/1087; H01L 29/41766; H01L 29/7783; H01L 23/481; H01L 29/2003; H01L 29/861; H01L 29/872; H01L 2924/0002
USPC ........................................................ 257/192
See application file for complete search history.

(56) References Cited

U.S. PATENT DOCUMENTS

| | | | |
|---|---|---|---|
| 7,859,057 B2 | 12/2010 | Yedinak et al. | |
| 8,357,976 B2 | 1/2013 | Yedinak et al. | |
| 2001/0032999 A1* | 10/2001 | Yoshida | H01L 29/66674 257/332 |
| 2004/0227211 A1* | 11/2004 | Saito | H01L 27/0605 257/578 |
| 2005/0012143 A1* | 1/2005 | Tanaka | H01L 29/4966 257/328 |
| 2006/0273347 A1* | 12/2006 | Hikita | H01L 29/66462 257/192 |
| 2007/0013021 A1 | 1/2007 | Ihang | |
| 2009/0072269 A1 | 3/2009 | Suh et al. | |
| 2009/0121775 A1* | 5/2009 | Ueda | H01L 29/739 327/427 |
| 2010/0117095 A1 | 5/2010 | Zhang | |
| 2011/0210337 A1 | 9/2011 | Briere | |
| 2011/0210338 A1 | 9/2011 | Briere | |
| 2011/0260174 A1 | 10/2011 | Hebert | |
| 2012/0313161 A1 | 12/2012 | Grivna et al. | |
| 2012/0326227 A1 | 12/2012 | Burke et al. | |
| 2013/0015501 A1 | 1/2013 | Briere | |
| 2013/0221436 A1 | 8/2013 | Hossain et al. | |
| 2014/0048850 A1 | 2/2014 | Jeon et al. | |

\* cited by examiner

CASCODE SEMICONDUCTOR DEVICE STRUCTURE AND METHOD THEREFOR

CROSS-REFERENCE TO RELATED APPLICATIONS

This application is a divisional application of U.S. application Ser. No. 14/853,729 filed on Sep. 14, 2015 and issued as U.S. Pat. No. 9,741,711 on Aug. 22, 2017, which claims priority from U.S. Provisional Patent Application No. 62/069,761 filed on Oct. 28, 2014, both of which are hereby incorporated by reference in their entirety.

BACKGROUND

The present invention relates, in general, to electronics and, more particularly, to semiconductor device structures and methods of forming semiconductor devices.

Power semiconductor devices, such as rectifiers, thyristors, bipolar transistors, metal oxide semiconductor field effect transistors (MOSFETs) are used in a wide variety of power conversion system. Such devices can be configured to control the flow of current through ON/OFF switching operations. The efficiency of a power conversion system may depend on the efficiency of the power semiconductor devices used in the power conversion systems.

Many power semiconductor devices used in power conversion systems are based on silicon. However, due to certain physical limitations of silicon and associated manufacturing processes used to make silicon-based devices have made it difficult to further increase the efficiency of silicon-based power semiconductor devices for certain applications. For example, some silicon-based devices use thick regions of lightly doped or intrinsically doped material that support high breakdown voltages, but result in high voltage drops in forward conduction mode. In high current applications, this is one source of power losses. Also, higher voltage silicon-based devices tend to have longer reverse recovery times, which further impact the efficiency of these devices. Additionally, discrete power semiconductor devices are often co-packaged with other electronic devices, which have made assembly and packing processes more complex, and this approach has generated parasitics into the power conversion system. Such parasitics have impaired system performance.

Accordingly, improved power semiconductor structures and methods of integrating and/or making such structures are needed that address the issues described above including power loss reduction as well as others. It would be beneficial for such structures and methods to be cost effective and compatible for manufacturing integration, and to not detrimentally affect device performance.

Figure 1:
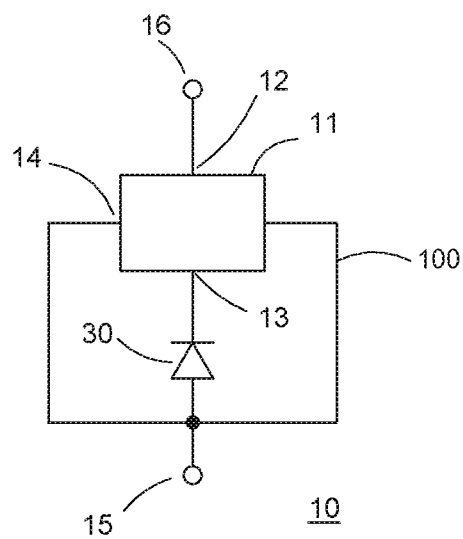
FIG. 1 illustrates a circuit schematic of a cascode rectifier structure including a rectifier device in accordance with an embodiment of the present invention.

For simplicity and clarity of the illustration, elements in the figures are not necessarily drawn to scale, and the same reference numbers in different figures denote the same elements. Additionally, descriptions and details of well-known steps and elements are omitted for simplicity of the description. As used herein, current-carrying electrode means an element of a device that carries current through the device, such as a source or a drain of an MOS transistor, an emitter or a collector of a bipolar transistor, or a cathode or anode of a diode, and a control electrode means an element of the device that controls current through the device, such as a gate of a MOS transistor or a base of a bipolar transistor. Although the devices are explained herein as certain N type regions and certain P type regions, a person of ordinary skill in the art understands that the conductivity types can be reversed and are also possible in accordance with the present description. Also, the devices explained herein can be Ga-face GaN devices or N-face GaN devices. One of ordinary skill in the art understands that the conductivity type refers to the mechanism through which conduction occurs such as through conduction of holes or electrons, therefore, and that conductivity type does not refer to the doping concentration but the doping type, such as P type or N type. It will be appreciated by those skilled in the art that the words during, while, and when as used herein relating to circuit operation are not exact terms that mean an action takes place instantly upon an initiating action but that there may be some small but reasonable delay(s), such as various propagation delays, between the reaction that is initiated by the initial action. Additionally, the term while means that a certain action occurs at least within some portion of a duration of the initiating action. The use of the word approximately or substantially means that a value of an element has a parameter that is expected to be close to a stated value or position. However, as is well known in the art there are always minor variances that prevent the values or positions from being exactly as stated. It is well established in the art that variances of up to at least ten percent (10%) (and up to twenty percent (20%) for semiconductor doping concentrations) are reasonable variances from the ideal goal of exactly as described. The terms first, second, third and the like in the claims or/and in the Detailed Description of the Drawings, as used in a portion of a name of an element are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein. For clarity of the drawings, doped regions of device structures are illustrated as having generally straight line edges and precise angular corners. However, those skilled in the art understand that due to the diffusion and activation of dopants the edges of doped regions generally may not be straight lines and the corners may not be precise angles. Additionally, it is to be understood that where it is stated herein that one layer or region is formed on or disposed on a second layer or another region, the first layer may be formed or disposed directly on the second layer or there may be intervening layers between the first layer and the second layer. Further, as used herein, the term formed on is used with the same meaning as located on or disposed on and is not meant to be limiting regarding any particular fabrication process. Moreover, the term "major surface" when used in conjunction with a semiconductor region, wafer, or substrate means the surface of the semiconductor region, wafer, or substrate that forms an interface with another material, such as a dielectric, an insulator, a conductor, or a polycrystalline semiconductor. The major surface can have a topography that changes in the x, y and z directions.

DETAILED DESCRIPTION OF THE DRAWINGS

In the present description, a "group III-V" semiconductor device or device structure or similar terms pertains to a compound semiconductor structure including one or more group III elements and one or more group V elements. Examples include, but are not limited to indium aluminum gallium nitride (InAlGaN), indium gallium nitride (InGaN), gallium nitride (GaN), and similar compounds as known to those of ordinary skill in the art. Additionally, "III-nitride semiconductor" pertains to a compound semiconductor structure including one or more group III elements. Examples include, but are not limited to InAlGaN, InGaN, GaN, AlGaN, AlN, InN, and similar compounds as known to those of ordinary skill the art.

The present description is directed to a group III-V semiconductor device structure integrated with a semiconductor-containing rectifier device (for example, a silicon-containing rectifier device) placed in series with the group III-V semiconductor device to form a cascode rectifier structure. In one embodiment, the rectifier device is configured to provide a vertical (i.e., perpendicular to the main current path of the group III-V semiconductor device) conduction path from the source electrode (cathode of the rectifier) to the substrate (anode of the system) of the group III-V semiconductor device. In accordance with the present embodiments, the breakdown voltage of the silicon diode can be low, as long as it is higher than the absolute value of the threshold voltage of the III-V semiconductor device. This ensures that in reverse blocking condition, the III-V material is turned off and blocks most of the reverse voltage. Also, the lower breakdown voltage enables the structure to have, for example, improved forward conduction and reverse recovery times compared to silicon-based power semiconductor devices In one embodiment, the group III-V semiconductor device is a normally-on transistor device having the control electrode electrically connected to a current carrying electrode, such as the source electrode. In accordance with the present embodiment, the substrate of the group III-V semiconductor device is connected to the anode electrode of the cascode rectifier structure. In other embodiments, the silicon-containing rectifier device and the group III-V semiconductor device are integrated together within a common semiconductor substrate. In one preferred embodiment, the silicon-containing rectifier device is configured to provide a current path that is generally perpendicular to the primary current path of the group III-V semiconductor device.

FIG. 1 illustrates a circuit diagram of a cascode rectifier structure 10 in accordance with one embodiment including a normally-on group III-V semiconductor device 11 and a normally-off rectifier device 30, such as a rectifier device. Having these two components connected together can increase complexity with device packaging techniques (e.g., added pin-outs and increased die pad size), and can have parasitic electrical issues with some connection techniques, which can degrade device performance. The present embodiments are concerned with addressing these issues as well as others.

In one embodiment, group III-V semiconductor device 11 is configured as a normally-on transistor and includes a first current carrying electrode or source electrode 13, a second current carrying electrode or drain electrode 12, and a control electrode or gate electrode 14. Cascode rectifier structure 10 further includes a rectifier device 30 with avalanche capability connected between source electrode 13 and a node 15. In accordance with the present embodiment, gate electrode 14 and a substrate 100 (further described in FIG. 3) in which cascode rectifier structure 10 is formed are electrically connected to node 15. Drain electrode 12 can be configured to be electrically connected to a node 16, such as a $V_{DD}$ node.

Figure 2:
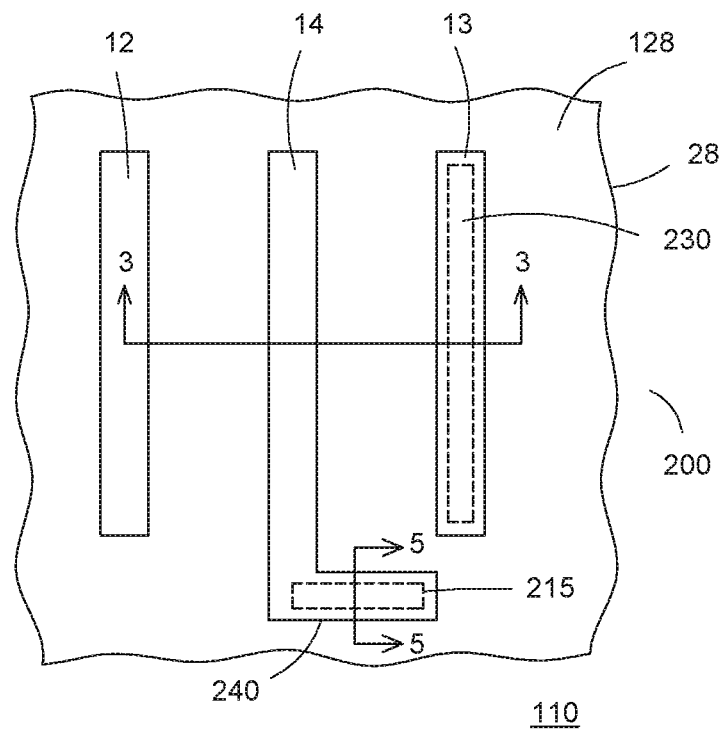
FIG. 2 illustrates a partial top plan view of a cascode rectifier structure in accordance with an embodiment of the present invention.

FIG. 2 illustrates a partial top plan view of a group III-V semiconductor structure 200 including an integrated rectifier device 230 in a cascode rectifier configuration 110 in accordance with a first embodiment. Structure 200 is an embodiment of group III-V semiconductor device 10 illustrated in FIG. 1, and includes a semiconductor substrate 28 having a major surface 128 over which various conductive electrode patterns are provided. More particularly, in one embodiment structure 200 includes first current carrying electrode or source electrode 13, control electrode or gate electrode 14, and second current carrying electrode or drain electrode 12. Group III-V semiconductor structure 200 is an example of a bond-over-active configuration, and it is understood that more than one layer of metallization can be used to interconnect the various electrodes.

In the present embodiment, the electrodes can have generally stripe-like shape and are generally parallel to each other with drain electrode 12 laterally spaced apart from source electrode 13 and having gate electrode 14 disposed laterally between drain electrode 12 and source electrode 13. In accordance with the present embodiment, structure 200 further includes an integrated rectifier device 230 disposed electrically connected to source electrode 13 and extending into semiconductor substrate 28. In accordance with the present embodiment, rectifier device 230 is electrically connected to node 15 as illustrated in FIG. 1. Additionally, in accordance with the present embodiment, gate electrode 14 is electrically connected to a region of semiconductor substrate 28 by a conductive trench electrode 215 disposed below a portion 240 of gate electrode 14.

Drain electrode 12, source electrode 13, and gate electrode 14 can be conductive materials suitable for use in group III-V semiconductor devices. In some embodiments, aluminum alloy materials with seed and anti-reflective coating layers can be used. In some embodiments, titanium-nitride/aluminum-copper/titanium-nitride materials can be used and can be formed using, for example, evaporation, sputtering, and/or plating techniques. The layers can be patterned using photo-lithographic and etch techniques. In some embodiments, multiple layers of conductive materials can be used to interconnect the electrodes to exposed pad structures and insulated from each other with inter-level dielectric layers. It is also understood that some or all of the electrodes illustrated can have field shaping structures incorporated with them, including field shaping structures/field plates placed at different levels within a multi-level metallization scheme.

Figure 3:
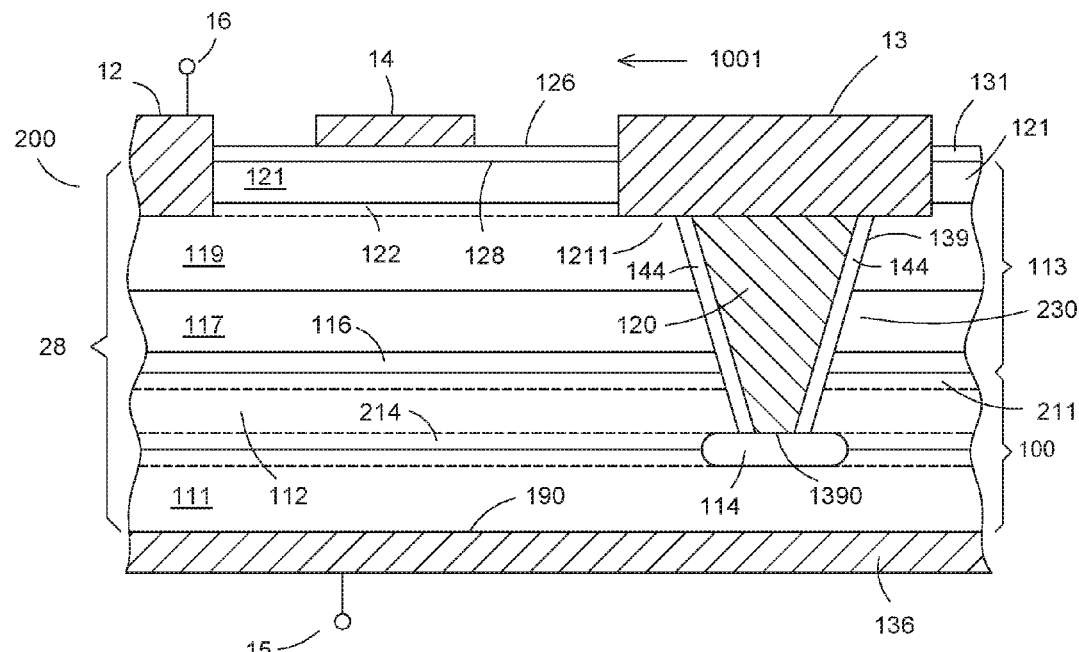
FIG. 3 illustrates a partial cross-sectional view of the cascode rectifier structure device structure of FIG. 2 taken along reference line 3-3.

FIG. 3 illustrates a partial cross-sectional view of group III-V semiconductor structure 200 integrated with rectifier device 230 in a cascode rectifier structure 110 in accordance with an embodiment taken along reference line 3-3 of FIG. 2. In one preferred embodiment, group III-V semiconductor structure 200 is configured as a normally-on device. In the present embodiment, group III-V semiconductor structure 200 includes semiconductor substrate 28, which can include a base substrate 100, base semiconductor substrate 100, a region of semiconductor material 100, semiconductor region 100, or semiconductor substrate 100. In several embodiments, substrate 100 is a silicon substrate having a (111) orientation. In other embodiments, substrate 100 can have other orientations. In other embodiments, substrate 100 can be silicon-carbide or other semiconductor materials. In one embodiment, substrate 100 includes a semiconductor region 112 and a doped region 111 that adjoins a major surface 190 of substrate 100. Semiconductor region 112 can be an intrinsically doped region or can be a lightly doped region, such as a lightly doped p type region. Alternatively, semiconductor region 112 can be heavily doped p type. Semiconductor region 112 can be formed using epitaxial formation techniques or other techniques as known to those of ordinary skill in the art. In one embodiment, doped region 111 can be doped p type and can have a graded dopant profile, such as a p+/p/p− profile where the p+ portion adjoins or is proximate to major surface 190 of substrate 100 with the dopant concentration decreasing in a desired manner as doped region 111 extends inward from major surface 190 of substrate 100. Doped region 111 can be formed using ion implantation and diffusion techniques, epitaxial formation techniques, or other techniques as known to those of ordinary skill in the art. It is understood that when semiconductor region 112 comprises a heavily doped region, doped region 111 may be optional.

In one embodiment, structure 200 includes a buffer layer or nucleation layer 116, a transition region 117, a channel layer 119, and a barrier layer 121 formed on or adjoining substrate 100. In some embodiments, buffer layer 116 can be, for example, an MN layer situated over substrate 100. Transition region 117 can be one or more AlGaN layers, where each layer can have different concentrations of Al. For example, the aluminum concentration can be higher in layers of transition region 117 closer to substrate 100 and the aluminum concentration can be lower in layers of transition region 117 closer to channel layer 119. In other embodiments, transition region 117 can comprise a super lattice structure disposed on buffer layer 116 and one or more back barrier layers disposed on the super lattice structure. In one embodiment, the back barriers comprise AlGaN layers of different thickness, Al concentration and carbon concentration. In some embodiments, the AlGaN back barrier next to the super lattice can have about 8% Al, a thickness of about 0.2 um, a carbon concentration of about $1.0 \times 10^{18}$ atoms/cm$^3$. In some embodiments, the second AlGaN back barrier layer is disposed over of the first AlGaN back barrier with about 8% Al, a thickness of about 0.8 um, and a carbon concentration of about $3.0 \times 10^{16}$ atoms/cm$^3$ or less. In one embodiment, channel layer 119 comprising GaN is disposed over the second AlGaN back barrier layer and the GaN channel layer can have a carbon concentration of less than about $3.0 \times 10^{16}$ atoms/cm$^3$, and a typical thickness of from about 100 nm to about 200 nm.

Channel layer 119 can be formed situated over buffer layer 116 or optional transition layers 117. In several embodiments, channel layer 119 can be, for example, a GaN layer. In some embodiments, barrier layer 121 can be AlGaN and can be formed over channel layer 119. Buffer layer 116, transition layer(s) 117, channel layer 119, and barrier layer 121 provide a heterostructure 113, and in one embodiment, can be formed using metal organic chemical vapor deposition ("MOCVD") techniques or other formation techniques as known to those of ordinary skill in the art. At the interface of the AlGaN layer 121 and the GaN channel 119 a two-dimensional electron gas (2DEG) layer or channel region 122 is created, as known to those of ordinary skill in the art. In other embodiments, wafer bonding techniques can be used to form the substrate configuration.

In some embodiments, group III-V semiconductor structure 200 can also include an insulation or insulative layer or layers 131 situated overlying portions of major surface 128 of structure 200, which can be, for example, silicon nitride, aluminum nitride, combinations thereof, or other insulative materials as known to those of ordinary skill in the art. In some embodiments, insulation layer 131 can be silicon nitride formed using plasma-enhanced chemical vapor deposition techniques ("PECVD"), low pressure chemical vapor deposition ("LPCVD"), metal organic chemical vapor deposition ("MOCVD"), or atomic layer deposition ("ALD"), and can have a thickness in some embodiments from about 0.1 microns to about 1.0 microns. In some embodiments, the silicon nitride forms part of a field plate that reduces the effect of the high electric fields that can be formed between the source and gate regions.

In some embodiments, group III-V semiconductor device 200 further includes gate dielectric layer 126 situated over a portion of barrier layer 121 as illustrated in FIG. 3. In other embodiments, any of the group III-V semiconductor devices described herein can be configured with a Schottky gate without gate dielectric layer 126. In some embodiments, gate dielectric region 126 can be silicon nitride, aluminum nitride, aluminum oxide, silicon dioxide or combinations thereof, hafnium oxide, or other materials as known to those of ordinary skill in the art. Control or gate electrode 14 is situated over gate dielectric region 126, and can be, for example, aluminum with a titanium and/or titanium-nitride barrier or other conductive materials as known to those of ordinary skill in the art.

In accordance with the present embodiment, a trench 139 is formed to extend from major surface 128 generally downward and extending through heterostructure 113, and into semiconductor region 112 of substrate 100. In accordance with the present embodiment, trench 139 extends below buffer layer 116. Trench 139 can be formed using photolithographic techniques and wet or dry etching techniques. In some embodiments, trench 139 is lined or covered with an insulating material or layer 144. Insulating layer 144 can be, for example, silicon oxide, silicon nitride, aluminum oxide, aluminum nitride, or other materials as known to those of ordinary skill in the art. Insulating layer 144 can be formed using PECVD techniques and/or atomic level deposition (ALD) techniques, and typically has a thickness sufficient to electrically isolate conductive electrode 120 from heterostructure 113. Portions of insulating layer 144 are removed from a bottom or lower surface 1390 of trench 139 to provide for electrical contact between conductive electrode 120 and semiconductor region 112. In some embodiments, insulating layer 144 is removed entirely from lower surface 1390 of trench 139 to expose a portion of semiconductor region 112 adjoining lower surface 1390. By way of example, an anisotropic etch process can be used to remove portions of insulating layer 144. In another example, a spacer process can be used to remove portions of insulating layer 144.

In accordance with the present embodiment, a doped region 114 can be disposed adjoining lower surface 1390 of trench 139. In one embodiment, doped region 114 can be an n type region, and can be formed using, for example, phosphorous or arsenic ion implantation and annealing techniques or other doping techniques as known to those of ordinary skill in the art. In an alternative embodiment, a series of ion implants can be used to create a predetermined doping profile that provides, for example, a desired breakdown characteristic for rectifier device 230. In some embodiments, doped region 114 adjoins or abuts doped region 111 or extends into doped region 111. In accordance with the present embodiment, trench 139 provides for a self-alignment feature for forming doped region 114 after trench 139 is formed by introducing dopant into substrate 100 through trench 139.

In alternative embodiment, doped region 114 can be replaced with doped region 214 (shown as a dashed-outline, which is configured to extend along a greater lateral portion of doped region 111 as illustrated in FIG. 3. In some embodiments, doped region 214 extends laterally across and below gate electrode 14 and drain electrode 12, and can be formed using epitaxial growth techniques, buried layer formation techniques, or other techniques as known to those of ordinary skill in the art. In this configuration, the diode area of rectifier device 230 is increased by continuous n type region 214, which in some embodiments is contacted in every cell of structure 200 by trench 139. Among other things, this preferably increases the current handling capability of rectifier device 230. In one embodiment, the n+ region can be made continuous with contacts made to it through the trench for every cell of the HEMT device. The substrate region above the n+/n/n− region can be made n− or p−. This region can be contacted also with the trench structure and will be at source potential. (This is close to ground as it cannot float above BVdss of diode in any application). In one embodiment, semiconductor region 112 above n type region 214 can also be made n type. In this configuration, semiconductor region 112 would be at the same electrical potential as source electrode 13 of structure 200. It was observed that this potential would be low because it is only a few volts above doped region 111 or the anode of rectifier device 230 thereby providing for a more stable electrical performance.

In a further embodiment, when semiconductor regions 112 is intrinsically doped or lightly p type doped, trench 139 can be etched deeper into substrate 100 to form a p-i-n diode on the surface of n type region 214 facing buffer region 116. In one embodiment, another p+/p/p− type region 211 (shown as a dashed line) is added adjacent the buffer region 116 substrate 100 interface and is electrically connected to the anode of rectifier device 230 using gate trench 215 (illustrated in FIG. 5). In this embodiment, the p-i-n diode is configured to have a higher breakdown voltage than the source voltage of structure 200. This configuration ensures that substrate 100 is at the anode potential thereby providing a more stable electrical performance. In another embodiment, region 211 can be brought into contact with region 214 to form a second diode structure. However, since the diode between region 214 and region 111 in this embodiment is contacted all across substrate 100, the region 214/region 111 diode provides the current path for conduction. In accordance with the present embodiment, the doped region configurations described above provide a method for making rectifier device 230 with desired electrical characteristics in a more manufacturable and repeatable way. In other embodiments, additional contacts can also be made to region 112 in the Z dimension to keep it at any desired potential. The dimensions of the epitaxial or various layers and their doping can be tuned in accordance with specific thermal budgets used during the growth processes for heterostructure 113. In most embodiments, since rectifier device 230 connected to the source of the normally-on device is a low voltage device, terminations may not be required. However, in other embodiment, any high voltage epitaxial structure can be terminated at the ends of the device using a trench or a moat etched structure (or mesa etch) all the way into substrate 100. In the case of the moat etch, the moat etched structure can be capped with a dielectric to ensure the proper termination of the high voltage diode and make it more reliable.

Trench 139 can be filled (which includes, but is not limited to completely filled) or lined (which includes, but is not limited to partially filled) with a conductive material to provide conductive electrode 120. In one embodiment, the conductive material can be used to further provide source electrode 13 over a portion of major surface 128 so that conductive electrode 120 and source electrode 13 are formed at the same time. In an alternative embodiment, conductive electrode 120 and source electrode 13 can be formed in two separate steps using the same or different materials. The conductive material can then be patterned using, for example, photolithographic and etch techniques to provide source electrode 13, drain electrode 12, and gate electrode 14 as generally illustrated in FIG. 3. In the present embodiment, trench 139 is placed directly below source electrode 13, which in this embodiment places trench 139 proximate to or adjacent to 2DEG region 122. In one embodiment, source electrode 13 is offset in a direction 1001 towards 2DEG region 122 to provide separation from trench 139 and 2DEG region 122. In one embodiment, ion implantation techniques can be used to remove the 2DEG region 122 in a portion 1211 adjacent to where rectifier device 230 adjoins channel layer 119 and barrier layer 121. In one embodiment, one or more nitrogen ion implant steps are used. In one embodiment, multiple ion implant doses and implant energies can be used. In some embodiments, the ion implant doses can be in a range from about $9.0 \times 10^{12}$ atoms/cm$^2$ to about $2.5 \times 10^{13}$ atoms/cm$^2$, and implant energies can range from about 30 keV to about 400 keV. In other embodiments, a shallow trench structure can be used to remove part of 2DEG region 122.

In the present embodiment, cascode rectifier 210 further includes a conductive electrode 136 disposed adjacent major surface 190 of substrate 100. In some embodiments, conductive electrode 136 can be a multi-layer structure (i.e., more than one metal) of titanium-nickel-silver, chrome-nickel-gold, or other conductive materials as known to those of ordinary skill in the art. In accordance with the present embodiments, conductive electrode 136 is configured anode of rectifier device 230 and is configured preferably to be electrically connected to node 15 in some applications as generally illustrated in FIGS. 1 and 3.

In accordance with the present embodiment, the breakdown voltage of rectifier device 230 is established or controlled by the doping profiles of doped region 114 (or 214) and/or doped region 111. Also, in accordance with the present embodiment rectifier device 230 is integrated within III-V semiconductor structure 200 to provide cascode rectifier structure 210. Another benefit of this configuration is that trench 139 is etched through heterostructure 113 into semiconductor region 112, which has been experimentally shown to reduce localized stresses in III-V semiconductor device 200. This allows reducing the thickness of heterostructure 113 and thereby improving its thermal performance of the group III-V semiconductor device 200. A further advantage with this embodiment is that conductive electrode 120 within trench 139 acts as a heat sinking device for source electrode 13. Also, this configuration of the present embodiment helps in tuning the breakdown voltage of rectifier device 230 by changing the doping profiles of regions 114 and 111. In other embodiments, semiconductor region 112 and doped region 111 (if used) can be n type with a lighter dopant concentration adjoining conductive electrode 136 to form a Schottky rectifier. In one embodiment of the Schottky rectifier, doped region 114 can be highly doped n type to provide an ohmic contact with conductive electrode 120. In other embodiments, doped region 114 is not used, and a Schottky diode is used as rectifier device 230. The Schottky can be formed along bottom portion 1390 of trench 139 using a Schottky barrier material. In some embodiments a diffused guard ring can be further incorporated to surround at least a peripheral portion of the Schottky device. In some embodiments, insulating layer 144 along the sidewalls of trench 139 can be excluded.

Figure 4:
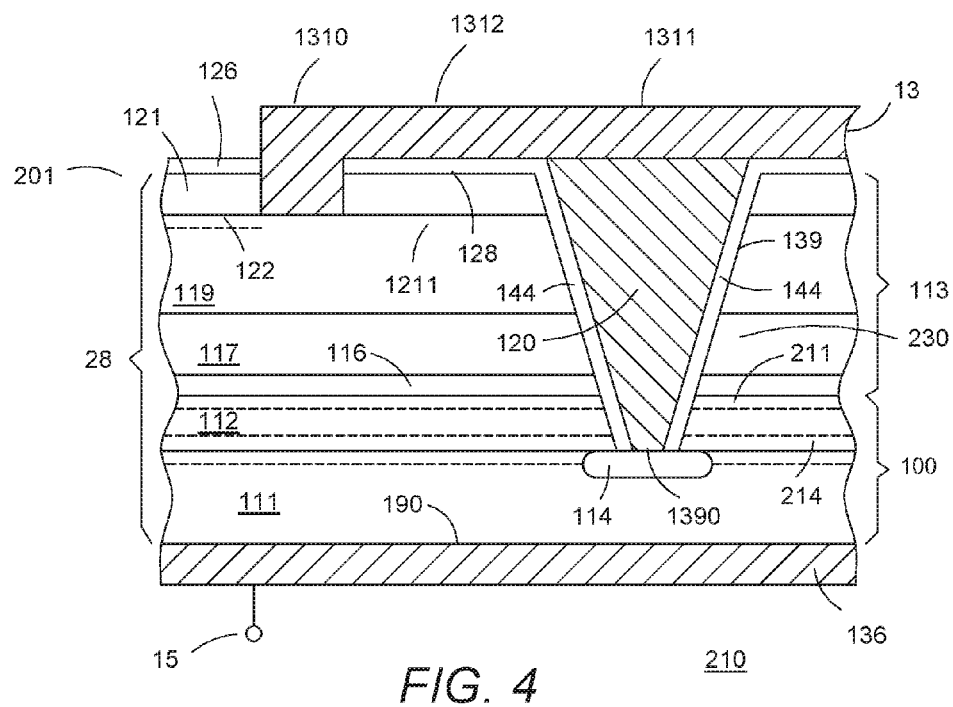
FIG. 4 illustrates a partial cross-sectional view of an alternative embodiment of a bond-over-active source electrode configuration in accordance with an embodiment of the present invention.

FIG. 4 illustrates a partial cross-sectional view of a group III-V semiconductor device 201 with rectifier device 230 in a cascode rectifier structure 210 in accordance with an alternative bond-over-active embodiment. Cascode rectifier structure 210 is similar to cascode rectifier structure 110 and only the differences will be described hereinafter. In this embodiment, source electrode 13 include a first part 1310 that makes ohmic contact to 2DEG region 122 and a second part 1311 that is laterally spaced apart from first part 1310 that makes contact to conductive electrode 120 in trench 139 of rectifier device 230. Source electrode 13 further includes a third part 1312 that connects first part 1310 to second part 1311. One benefit of this configuration is that the separation reduces electrical interaction between rectifier device 230 and the ohmic contact between portion 1310 of source electrode 13 and 2DEG region 122.

Figure 5:
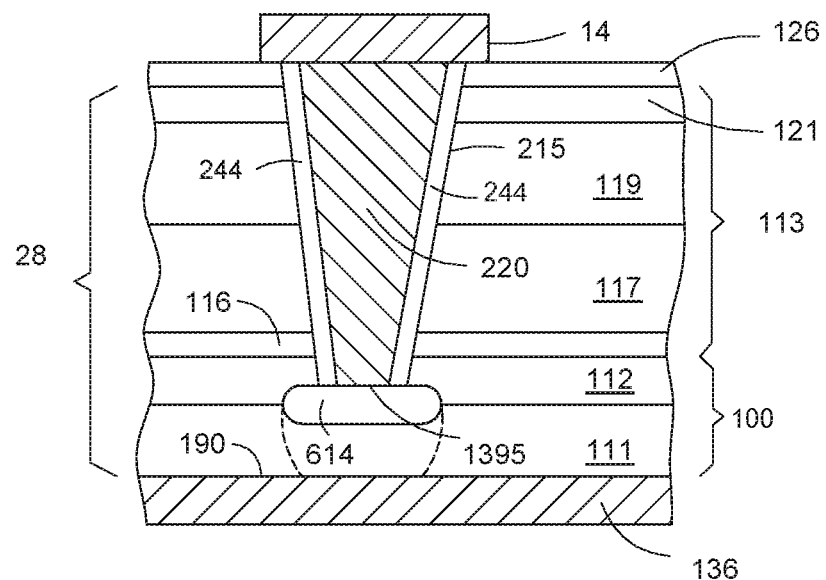
FIG. 5 illustrates a partial cross-sectional view of the cascode rectifier structure device structure of FIG. 2 taken along reference line 5-5.

FIG. 5 illustrates a partial cross-sectional view of cascode rectifier structure 210 taken along reference line 5-5 of FIG. 2. More particularly, FIG. 5 illustrates a structure connecting gate pad 14 to substrate 100 using a similar structure to conductive electrode 120 and trench 139. This provides for, among other things, a final die layout that places the cathode overlying major surface 128 and the anode overlying major surface 190, which simplifies the integration of the devices. Cascode rectifier structure 110 further includes a trench 215 having sidewall surface lined or covered with insulating layer 144 and filled or partially filled with conductive material to form a conductive electrode 220. A p type doped region 614 is disposed adjoining a lower surface 1395 of trench 215 and adjoining doped region 111. In one embodiment, p type doped region 614 extends partially into doped region 111. In other embodiments, p type doped region 614 can extend proximate to or all the way to major surface 190 of semiconductor substrate 28. In one embodiment, a dielectric layer 244 separates gate electrode 14 from a second level of metallization 112, which can be used, for example, to connect to drain electrode 12. In accordance with the present embodiment, conductive electrode 220 is configured to electrically connect gate electrode 14 to substrate 100 in cascode configuration 10. In one embodiment, trench 215 and conductive electrode 220 have no active device area below these structures.

Figure 6:
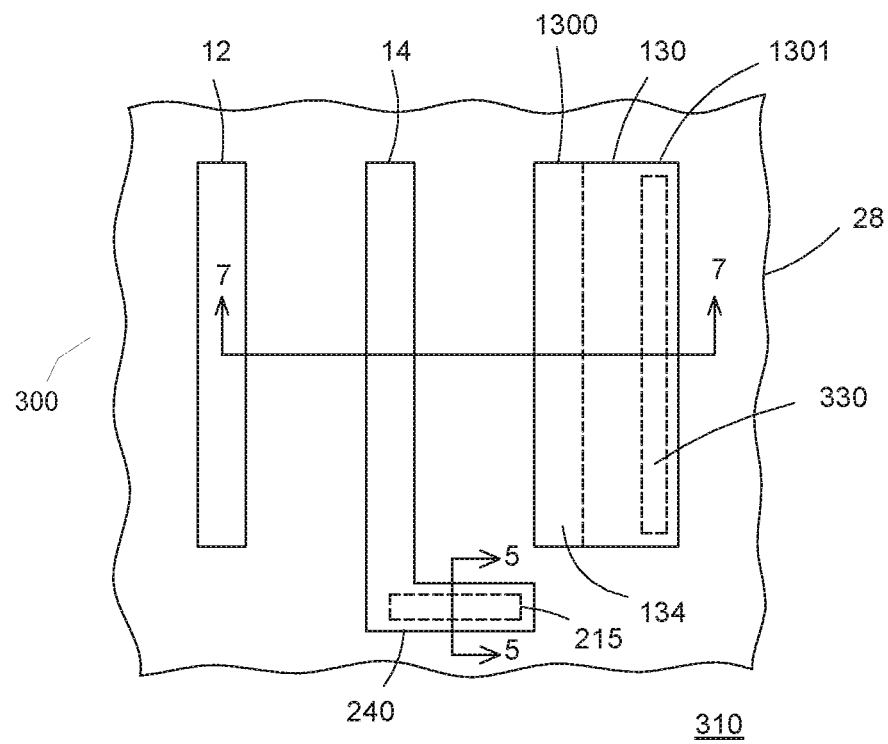
FIG. 6 illustrates a partial top plan view of a cascode rectifier structure in accordance with a further embodiment of the present invention.

FIG. 6 illustrates a partial top plan view of a group III-V semiconductor device structure 300 with a rectifier device 330 in a cascode rectifier structure 310 in accordance with a further embodiment. Cascode rectifier structure 310 is similar to cascode rectifier structure 210 with only the differences described hereinafter. Specifically, cascode rectifier structure 310 uses a source pad 130 with a rectifier device 330 formed as a separate structure. For example, a separate structure placed away from the active area of cascode rectifier structure 310. In the present embodiment, a first part 1300 of source electrode 130 makes ohmic contact to 2DEG region 122 and a second part 1301 has trench 139 disposed beneath or below it. More particularly, this configuration places trench 139 spaced apart from or laterally spaced away from 2DEG region 122 to reduce any electrical interference between rectifier device 330 and the active device of group III-V semiconductor device 300.

Figure 7:
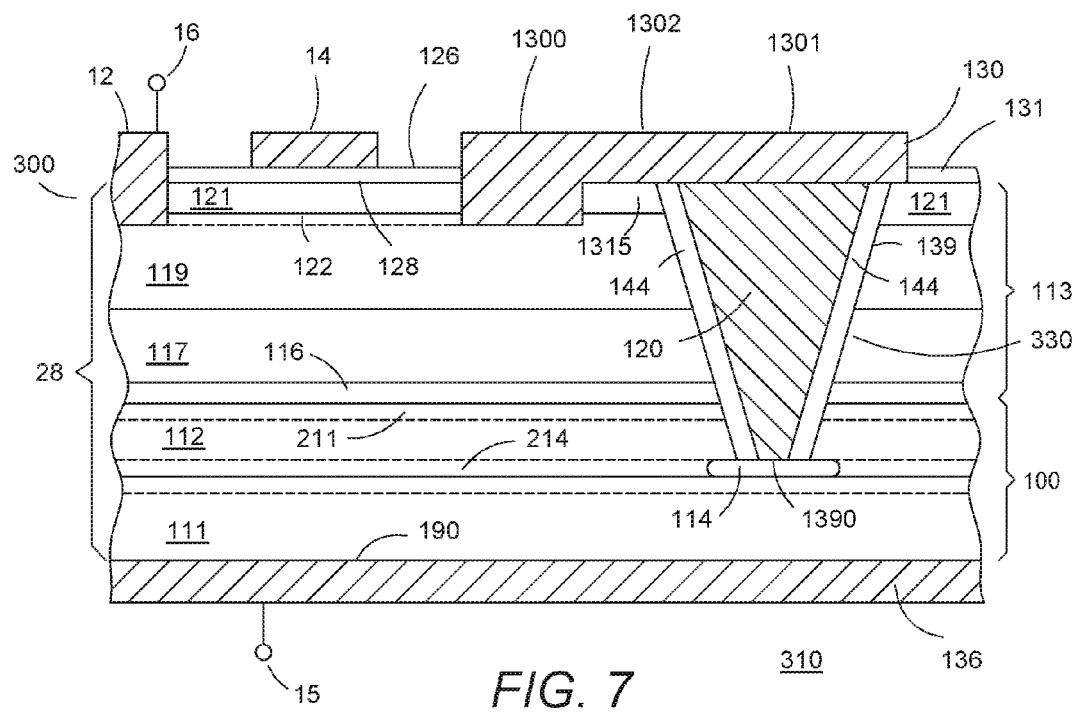
FIG. 7 illustrates a partial cross-sectional view of the cascode rectifier structure device structure of FIG. 6 taken along reference line 7-7.

FIG. 7 illustrates a partial cross-sectional view of cascode rectifier device 310 of FIG. 6 taken along reference line 7-7. In the present embodiment, source electrode 130 includes first part 1300 that is electrically connected to a source end of 2DEG region 122 and a second part 1301 that is electrically connected to conductive electrode 120 in trench 139 of rectifier device 330. A third part 1302 of source electrode 130 connects first part 1300 to second part 1301. In some embodiments, ion implantation techniques can be used to remove the 2DEG region 122 in a portion 1315 below third part 1302 where channel layer 119 adjoins barrier layer 121. In one embodiment, one or more nitrogen ion implant steps are used. In one embodiment, multiple ion implant doses and implant energies can be used. In some embodiments, the ion implant doses can in a range from about $9.0 \times 10^{12}$ atoms/cm$^2$ to about $2.5 \times 10^{13}$ atoms/cm$^2$, and implant energies can range from about 30 keV to about 400 keV. In other embodiments, a shallow trench structure can be used to remove part of 2DEG region 122. One advantage of the present embodiment is that rectifier device 330 can have larger area for current conduction and termination structures can be added around the source pad to increase breakdown voltage.

Figure 8:
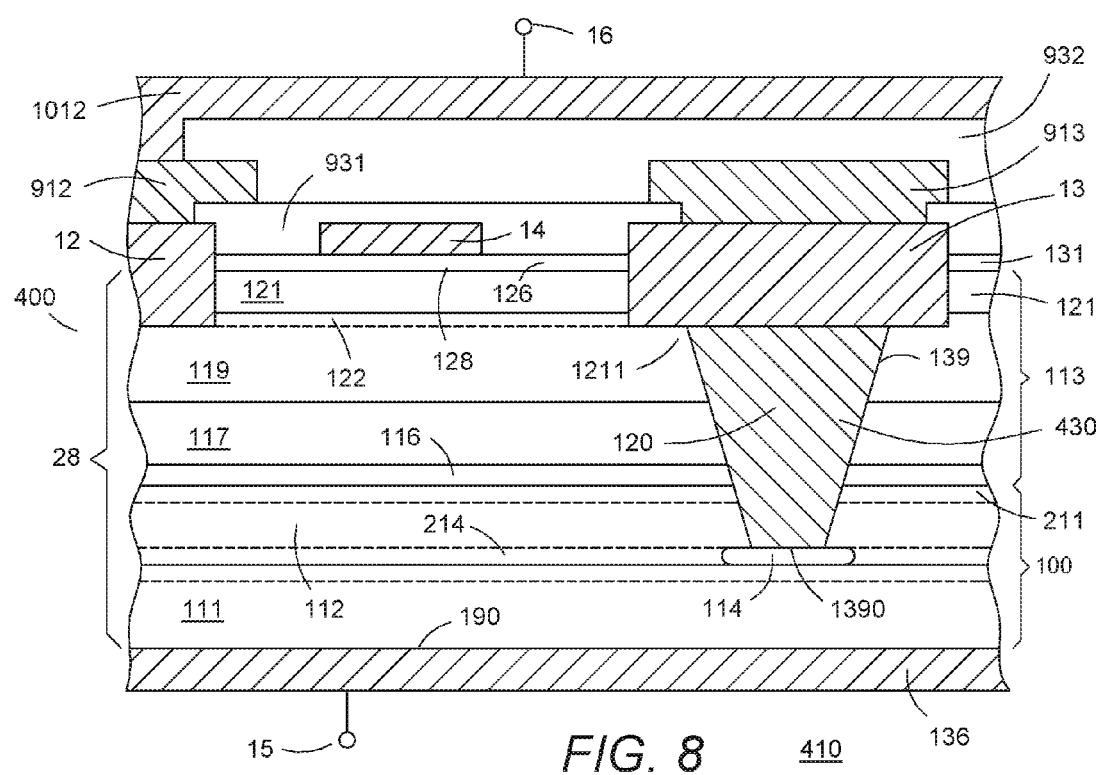
FIG. 8 illustrates a partial cross-sectional view of a cascode rectifier structure in accordance with another embodiment of the present invention.

FIG. 8 illustrates a partial cross-sectional view of a group III-V semiconductor device 400 integrated with a rectifier device 430 in a cascode rectifier structure 410 in accordance with another embodiment. Cascode rectifier structure 410 is similar to cascode rectifier structure 110 of FIG. 3, and only the differences will be described hereinafter. In one embodiment, rectifier device 430 is provided without insulating layer 144 along sidewall surfaces of trench 139 and conductive electrode 120 is connected to heterostructure 113 and a portion of substrate 100. Additionally, cascode rectifier structure 410 is provided with a multi-level conductive layer configuration, which comprises a conductive layer 912 electrically connected to drain electrode 12 and a conductive layer 1012 electrically connected to second conductive layer 912. In addition, an optional conductive layer 913 can be electrically connected to source electrode 13 to provide desired routing capability. A first interlayer dielectric (ILD) 931 insulates gate electrode 14 and a second ILD 932 insulates agate electrode 14 and conductive layer 913. In one embodiment, conductive layer 1012 extends across the active area of cascode rectifier structure 410.

Figure 9:
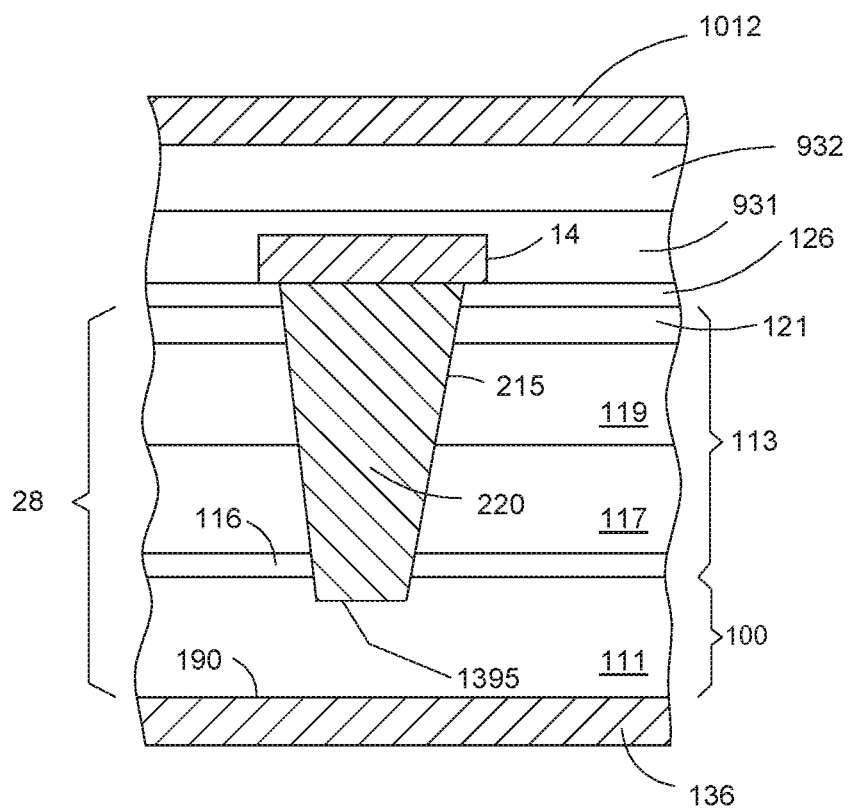
FIG. 9 illustrates a partial cross-sectional view of another portion of the cascode rectifier structure of FIG. 8.

FIG. 9 illustrates a partial cross-sectional view of another portion of cascode rectifier structure 410. The partial cross-sectional view of FIG. 9 is similar to structure illustrated in FIG. 5 and only the differences will be described hereinafter. In the present embodiment, insulating layer 244 is not used along sidewall surfaces of trench 215 so that conductive electrode 220 is in contact with heterostructure 113. In this embodiment, 2DEG channel 121 is removed in the region of heterostructure 113 using, for example, the ion implantation process described previously. In the absence of 2DEG channel 121, leakage and/or breakdown issues are reduced. Additionally, in this embodiment doped region 111 comprises a p+ type region, which can eliminate the need for semiconductor region 112 and doped region 614 so that lower surface 1395 makes electrical contact with doped region 111. One advantage of this embodiment is that it reduces the number of processing steps thereby reducing manufacturing costs.

Figure 10:
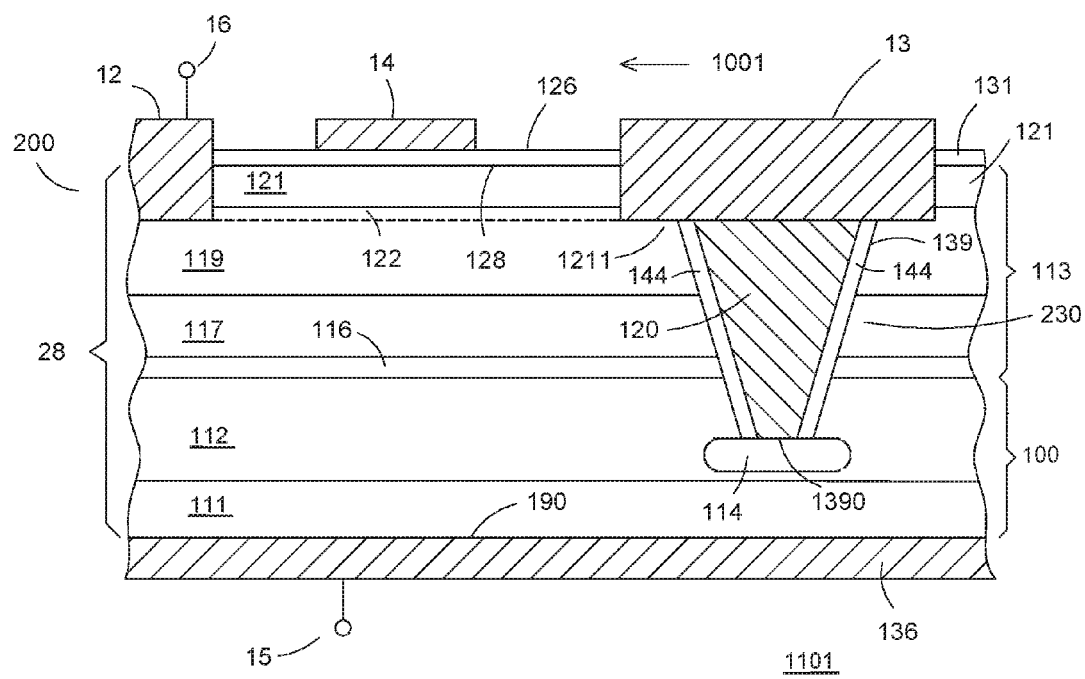
FIG. 10 illustrates a partial cross-sectional view of the cascode rectifier structure device structure of FIG. 2 taken along reference line 3-3 in accordance with a further embodiment of the present invention.

FIG. 10 illustrates a partial cross-sectional view of group III-V semiconductor structure 200 integrated with rectifier device 230 in a cascode rectifier structure 1101 in accordance with another embodiment taken along reference line 3-3 of FIG. 2. Cascode rectifier structure 1101 is similar to cascode rectifier structure 110 and only the differences will be described hereinafter. Specifically, in cascode rectifier structure 1101, doped region 111 of substrate 100 comprises a p or p+ type region and semiconductor region 112 comprises an n type region. In one embodiment, doped region 114 comprises an n+ type doped region. In the present embodiment, n type semiconductor region 112 preferably terminates in the active area of cascode rectifier structure 1101 and does not extend to the edge of the die. In one embodiment, n type semiconductor region 112 can be formed by selective epitaxy or by masked implant during epitaxial growth. In one embodiment, p type doped region 111 can be continuous to the edge of the die. In accordance with the present embodiment, the breakdown voltage of rectifier device can be determined based on the dopant concentrations of n-type semiconductor region 112 and the vertical distance between doped region 114 and p type doped region 111. In this embodiment, a conductive trench electrode 220 connecting gate pad 14 to substrate 100 as illustrated in FIG. 5 can be used to connect the gate to the anode of the rectifier.

Figure 11:
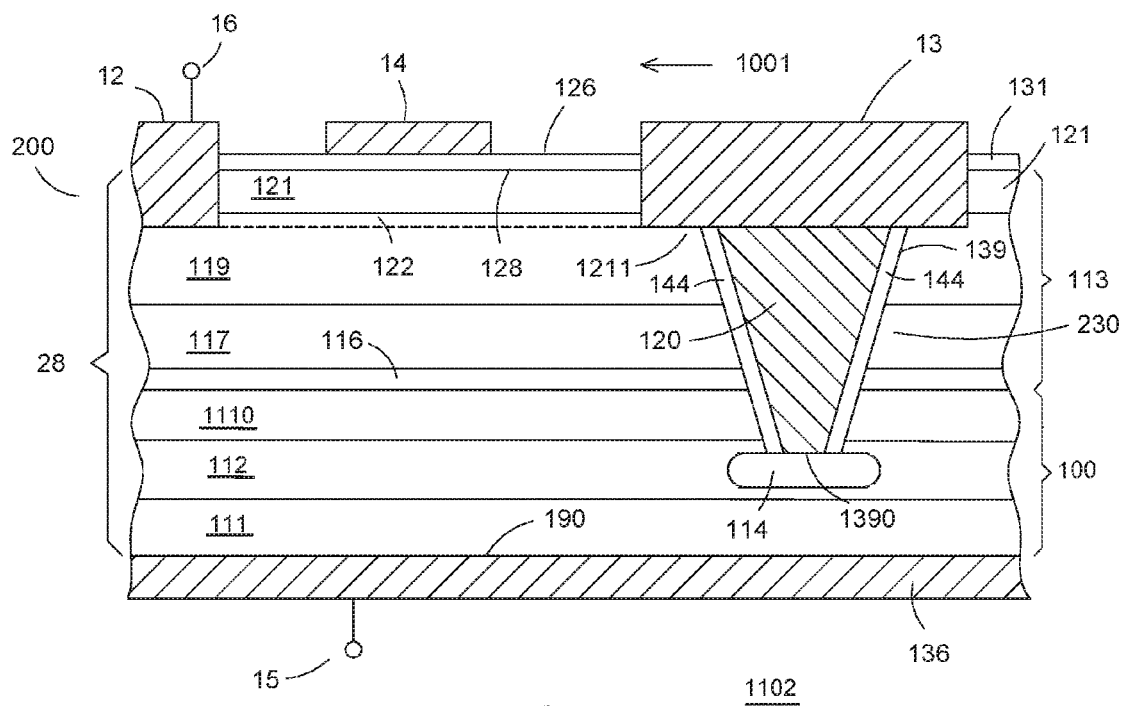
FIG. 11 illustrates a partial cross-sectional view of the cascode rectifier structure device structure of FIG. 2 taken along reference line 3-3 in accordance with a still further embodiment of the present invention.

FIG. 11 illustrates a partial cross-sectional view of group III-V semiconductor structure 200 integrated with rectifier device 230 in a cascode rectifier structure 1102 in accordance with a further embodiment taken along reference line 3-3 of FIG. 2. Cascode rectifier structure 1102 is similar to cascode rectifier structure 1101 and only the differences will be described hereinafter. Specifically, in cascode rectifier structure 1102, a p type doped region 1110 is formed over n type semiconductor region 112. In one embodiment, n type semiconductor region 112 preferably terminates in the active area of cascode rectifier structure 1102 and does not extend to the edge of the die. In one embodiment, n type semiconductor region 112 can be formed by selective epitaxy or by masked implant during epitaxial growth. Similarly, in cascode rectifier structure 1102 doped region 114 comprises an n+ type doped region. In one embodiment, both p type doped regions 111 and 1110 can be continuous to the edge of the die. In accordance with the present embodiment, the breakdown voltage of rectifier device can be determined based on the dopant concentrations of n-type semiconductor region 112 and the vertical distance between doped region 114 and p type doped regions 111 and 1110. In this embodiment, a conductive trench electrode 220 connecting gate pad 14 to substrate 100 as illustrated in FIG. 5 can be used to connect the gate to the anode of the rectifier.

With reference back to FIG. 1, the operation of cascode rectifier structure 10 will be described. In accordance with the present embodiment, the cascode rectifier structures are two terminal devices, namely the cathode and the anode. Similar to basic rectifiers, cascode rectifier structure has two basic states of operation—reverse blocking and forward conduction. Under a reverse blocking state of operation, a high voltage is applied to the cathode with reference to the anode. In one embodiment, as the voltage on the cathode/drain of the normally-on device is increased, the voltage on source or node 13 of the normally-on device also rises. As the voltage on source or node 13 increases, the gate-to-source voltage (i.e., difference in voltage between gate or node 14 and source or node 13) gains negative potential. When the magnitude of this voltage reaches the threshold voltage of the normally-on device, it starts to turn off and block the high reverse voltage on drain 12. The breakdown voltage of device 30 should be equal to or greater than the midpoint voltage between the two devices at node 13.

Under the forward conduction state of operation, the anode is at a higher voltage relative to the cathode. In this condition, rectifier device 30 is forward biased, and current flows through the channel of normally-on device 11 to the cathode. Thus, the forward voltage drop across rectifier 30 is the sum of the diode voltage drop of device 11 and the voltage drop across device 11.

Relevant features of the present embodiments include, but are not limited to including or integrating a rectifier device with a group III-V transistor to provide an integrated cascode rectifier device having reduced power losses compared to silicon power semiconductor devices. In particular, since a lower breakdown voltage rectifier device can be used, the structure provides a high voltage power device with improved forward conduction and reduced recovery times, compared to high voltage silicon-based rectifier devices, which improves power conversion efficiencies. In accordance with the present embodiment, the breakdown voltage of the rectifier device can be controlled by the doping profiles of selected doped regions. Another benefit of this configuration is that the trench is etched through the heterostructure into the underlying semiconductor region, which has been experimentally shown to reduce localized stresses in integrated device. This allows reducing the thickness of the heterostructure and thereby improving its thermal performance of the group III-V cascode rectifier device. A further advantage is that the conductive electrode within the trench acts as a heat sinking device for the source electrode. Also, this configuration of the present embodiments helps in tuning the breakdown voltage of the rectifier device by changing the thickness of the intrinsic region or changing the dopant concentration of the semiconductor region(s).

In view of all of the above, it is evident that novel group III-V cascode rectifier structures and methods of making the same have been described. Included, among other features, are a group III-V transistor device integrated with a semiconductor rectifier, such as a lower voltage silicon rectifier that provides a conduction path generally perpendicular to the conduction path of the group III-V transistor device. The present embodiments provide, among other things, configurations to integrate a rectifier device with a group III-V transistor to provide an integrated cascode rectifier structure. This avoids a discrete solution, which requires co-packaging and its associated costs and parasitic issues. Further, the present embodiments provide built-in heat sinking capability and have reduced stress.

While the subject matter of the invention is described with specific preferred embodiments and example embodiments, the foregoing drawings and descriptions thereof depict only typical embodiments of the subject matter, and are not therefore to be considered limiting of its scope. It is evident that many alternatives and variations will be apparent to those skilled in the art.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of the invention. Furthermore, while some embodiments described herein include some but not other features included in other embodiments, combinations of features of different embodiments are meant to be within the scope of the invention and meant to form different embodiments as would be understood by those skilled in the art.

What is claimed is:

1. A semiconductor device comprising:
   a semiconductor substrate having a first major surface and an opposing second major surface, wherein the semiconductor substrate comprises a first doped region having a first conductivity type adjacent the second major surface;
   a heterostructure adjacent the first major surface, wherein the heterostructure comprises:
      a channel layer comprising a group III-V material; and
      a barrier layer disposed over the channel layer and comprising a group III-V material;
   a first electrode disposed proximate to a first portion of the channel layer;
   a second electrode disposed proximate to a second portion of the channel layer and spaced apart from the first electrode;
   a control electrode disposed between the first electrode and the second electrode;
   a first trench electrode extending through the heterostructure into the semiconductor substrate, wherein the first trench electrode is electrically coupled to the first electrode;
   a second trench electrode extending through the heterostructure and the semiconductor substrate at least to the first doped region, wherein the second trench electrode electrically connects the control electrode to a third electrode disposed adjacent to the second major surface, and wherein the control electrode is electrically coupled to the third electrode through the semiconductor substrate; and
   a rectifier device comprising a second doped region of a second conductivity type opposite to the first conductivity type disposed adjoining the first trench electrode in the semiconductor substrate, wherein:
      the rectifier device is electrically coupled to the first trench electrode and electrically coupled to the third electrode, but not electrically coupled to the second electrode;
      the rectifier device is configured to provide a current path generally perpendicular to the channel layer; and
      the semiconductor device is configured as a two terminal device.

2. The semiconductor device of claim 1, wherein:
   the semiconductor device comprises a group III-V transistor structure;
   the first electrode comprises a source electrode;
   the second electrode comprises a drain electrode; and
   the first electrode overlaps the first trench electrode.

3. The semiconductor device of claim 2, wherein the first trench electrode is inset from at least one side surface of the first electrode.

4. The semiconductor device claim 1, wherein the second doped region and the second electrode overlap.

5. The semiconductor device of claim 1 further comprising a third doped region of the first conductivity type disposed between the semiconductor substrate and the heterostructure.

6. A semiconductor device comprising:
   a semiconductor substrate having a first major surface and an opposing second major surface;
   a heterostructure adjacent the first major surface, the heterostructure comprising:
      a group III-V channel layer; and
      a group III-V barrier layer over the group III-V channel layer;
   a first electrode disposed proximate to a first portion of the group III-V channel layer;
   a second electrode disposed proximate to a second portion of the group III-V channel layer and spaced apart from the first electrode;
   a third electrode disposed on the second major surface of the semiconductor substrate;
   a control electrode disposed between the first electrode and the second electrode;
   a fourth electrode electrically coupled to the first electrode and the semiconductor substrate; and
   a rectifier device disposed in the semiconductor substrate and electrically coupled to the fourth electrode and electrically coupled to the third electrode, but not electrically coupled to the second electrode;
   the rectifier device is configured to provide a current path generally perpendicular to the channel layer; and
   the control electrode is electrically connected to the third electrode through the semiconductor substrate to provide the semiconductor device as a two terminal device.

7. The semiconductor device of claim 6, wherein the rectifier device comprises a first doped region having a first conductivity type and adjoining a lower surface of the fourth electrode, and wherein the semiconductor substrate comprises:
   a semiconductor region adjacent the first doped region and comprising a second conductivity type opposite to the first conductivity type; and
   a second doped region having the second conductivity type and adjoining the second major surface, wherein the second doped region has a higher dopant concentration than the semiconductor region.

8. The semiconductor device of claim 7, wherein the fourth electrode comprises a first trench electrode extending through the heterostructure, and wherein the control electrode is electrically coupled to the second doped region with a second trench electrode extending through the heterostructure into the semiconductor substrate.

9. The semiconductor device of claim 8 further comprising a third doped region of the second conductivity type disposed adjoining an interface between the heterostructure and the semiconductor substrate.

10. The semiconductor device of claim 8, wherein the heterostructure is devoid of a channel region proximate to the second trench electrode, and wherein the second trench electrode comprises a trench and a conductive electrode.

11. The semiconductor device of claim 10, wherein the second trench electrode further comprises a dielectric material between sidewalls of the trench and the conductive electrode.

12. The semiconductor device of claim 6, wherein:
   the rectifier device comprises a Schottky rectifier; and
   the third electrode and the second major surface of the semiconductor substrate are configured as a Schottky contact.

* * * * *